US011968818B2

(12) United States Patent
Hwang et al.

(10) Patent No.: US 11,968,818 B2
(45) Date of Patent: Apr. 23, 2024

(54) SRAM MEMORY CELL FOR STACKED TRANSISTORS WITH DIFFERENT CHANNEL WIDTH

(71) Applicant: SAMSUNG ELECTRONICS CO., LTD., Suwon-si (KR)

(72) Inventors: Inchan Hwang, Schenectady, NY (US); Hwichan Jun, Clifton Park, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 238 days.

(21) Appl. No.: 17/345,504

(22) Filed: Jun. 11, 2021

(65) Prior Publication Data

US 2022/0302134 A1 Sep. 22, 2022

Related U.S. Application Data

(60) Provisional application No. 63/163,372, filed on Mar. 19, 2021.

(51) Int. Cl.
*H01L 27/11* (2006.01)
*H01L 23/528* (2006.01)
*H01L 27/092* (2006.01)
*H01L 29/423* (2006.01)
*H01L 29/786* (2006.01)
*H10B 10/00* (2023.01)

(52) U.S. Cl.
CPC ....... *H10B 10/125* (2023.02); *H01L 23/5286* (2013.01); *H01L 27/0922* (2013.01); *H01L 29/42392* (2013.01); *H01L 29/78642* (2013.01); *H01L 29/78696* (2013.01)

(58) Field of Classification Search
CPC ...... H10B 10/125; H10B 10/12; H10B 10/18; H01L 23/5286; H01L 27/0922; H01L 29/42392; H01L 29/78642; H01L 29/78696; H01L 21/823475; H01L 27/0688; G11C 7/18; Y10S 257/903
USPC ........................................... 257/329
See application file for complete search history.

(56) References Cited

U.S. PATENT DOCUMENTS

| | | | |
|---|---|---|---|
| 10,332,588 B2 | 6/2019 | Huynh Bao et al. | |
| 10,373,942 B2 | 8/2019 | Asra et al. | |
| 10,453,522 B2 | 10/2019 | Diaz et al. | |
| 10,483,166 B1 | 11/2019 | Cheng et al. | |
| 10,818,674 B2 | 10/2020 | Mann et al. | |
| 10,818,675 B2 | 10/2020 | Hsieh et al. | |
| 10,840,146 B1 | 11/2020 | Paul et al. | |
| 11,244,949 B2 | 2/2022 | Weckx et al. | |
| 2019/0172822 A1* | 6/2019 | Asra | H01L 27/0924 |
| 2019/0386011 A1* | 12/2019 | Weckx | G11C 11/412 |

(Continued)

*Primary Examiner* — Tong-Ho Kim
(74) *Attorney, Agent, or Firm* — Sughrue Mion, PLLC

(57) ABSTRACT

A semiconductor device including a static random access memory (SRAM) in a three-dimensional (3D) stack is provided. The semiconductor device includes a first transistor stack including a first channel and a first gate, a second transistor stack including a second channel and a second gate, the second transistor stack being disposed above the first transistor stack, a bit line disposed on a first portion of an upper surface of the first channel, a voltage source disposed on a first portion of an upper surface of the second channel and a first shared contact connecting the first channel to the second channel, where a width of the second channel is less than a width of the first channel.

20 Claims, 11 Drawing Sheets

(56) References Cited

U.S. PATENT DOCUMENTS

2020/0135718 A1    4/2020   Liebmann et al.
2020/0365464 A1   11/2020   Sreenivasan et al.
2021/0043522 A1    2/2021   Chanemougame et al.
2022/0093593 A1*   3/2022   Yang .................... H10B 10/125

\* cited by examiner

SRAM MEMORY CELL FOR STACKED TRANSISTORS WITH DIFFERENT CHANNEL WIDTH

CROSS-REFERENCE TO RELATED APPLICATION

This application is based on and claims priority to U.S. Provisional Application No. 63/163,372 filed on Mar. 19, 2021, in the United States Patent and Trademark Office, the disclosure of which is incorporated by reference herein in its entirety.

BACKGROUND

1. Field

One or more embodiments of the disclosure relate to a semiconductor device, and more particularly, to different channel widths of a static random access memory (SRAM) transistors in a three-dimensional (3D) stacked device.

2. Description of the Related Art

The size of transistors continues to shrink in order to sustain scaled down logic circuits in electronic devices. However, as the continuous reduction in the size of transistors faces physical limits, planar-structured transistors have evolved into gate all-around structures, such as fin field-effect transistor (FinFET) and nanosheet transistor, also referred to as multi-bridge channel FET (MBCFET), in order to concentrate more transistors in a certain area size and to place more control over a channel and a gate of a transistor. Because the technology to reduce the size of a single transistor has its limits, there has been an ongoing research into a three-dimensional form in which transistors are vertically stacked into a 3D structure to provide higher density in transistor integration.

A static random access memory (SRAM) is a type of random access memory made up of transistors, and is one of the most essential elements in a cache memory. As such, there has been an ongoing research on circuitry and physical structure of SRAM to tightly optimize areal density and performance. Generally, an SRAM circuit consists of two (2) n-type metal-oxide semiconductor (NMOS) transistors and two (2) p-type metal oxide semiconductor (PMOS) transistors for two inverters, and two NMOS transistors for pass-gate transistors on a single plane. However, the planar-structured SRAM require more space to fit in transistors (e.g., four NMOS transistors and two PMOS transistors), thereby increasing the size of a chip.

Therefore, one or more layouts for active and cross-coupled contacts in a 3D stacked SRAM device are provided to optimize areal density and performance of the 3D stacked SRAM.

SUMMARY

According to an embodiment, there is provided a semiconductor device including a first transistor stack including a first channel and a first gate; a second transistor stack including a second channel and a second gate, the second transistor stack being disposed above the first transistor stack; a bit line disposed on a first portion of an upper surface of the first channel; a voltage source disposed on a first portion of an upper surface of the second channel; and a first shared contact connecting the first channel to the second channel. A width of the second channel is less than a width of the first channel.

According to an embodiment, there is provided a semiconductor device including: a three-dimensional (3D) stack including a plurality of transistors disposed in a first layer and a second layer, the second layer being disposed above the first layer; the first layer including a first gate and a first channel of a first transistor and a second gate and a second channel of a second transistor, among the plurality of transistors; the second layer including a third gate and a third channel of a third transistor and a fourth gate and a fourth channel of a fourth transistor, among the plurality of transistors; and a first shared contact and a second shared contact. The third channel is disposed above the first channel, and is connected to the first channel by the first shared contact, the fourth channel is disposed above the second channel, and is connected to the second channel by the second shared contact, and a width of the third channel is less than a width of the first channel, and a width of the fourth channel is less than a width of the second channel.

According to an embodiment, there is provided a three-dimensional (3D) transistor stack includes an inverter including a first channel of a first transistor and a second channel of a second transistor, the second channel being disposed directly above the first channel; a bit line disposed on an upper surface of the first channel; a voltage source disposed on an upper surface of the second channel; a voltage ground disposed on the first channel; and a shared contact connecting the first channel to the second channel. A width of the second channel is less than a width of the first channel.

BRIEF DESCRIPTION OF DRAWINGS

The above and other aspects, features, and advantages of certain embodiments of the disclosure will be more apparent from the following description taken in conjunction with the accompanying drawings in which.

DETAILED DESCRIPTION

Figure 1:
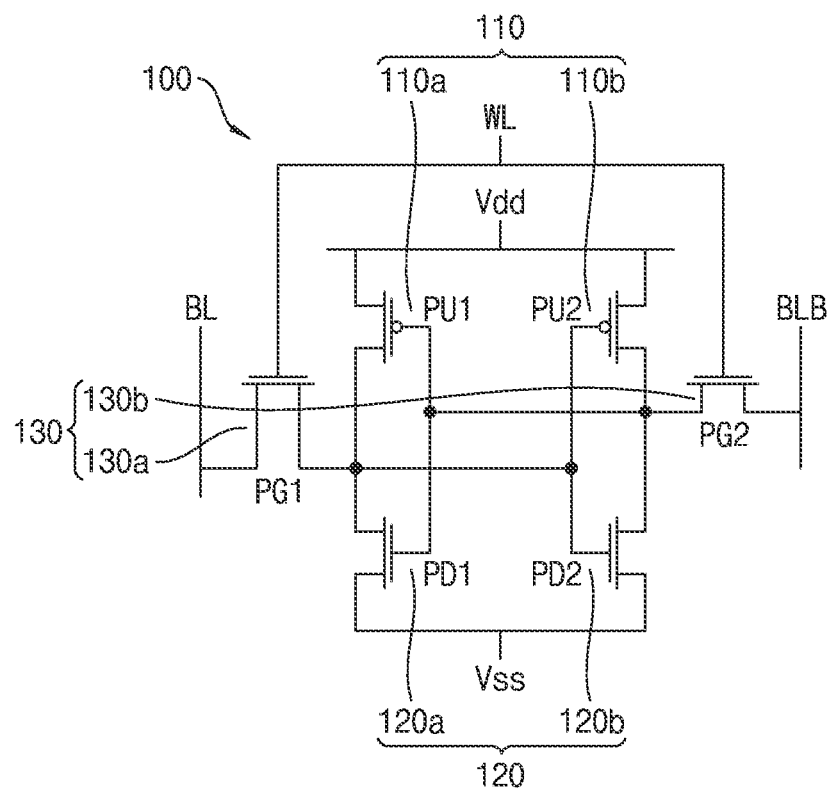
FIG. 1 is a diagram illustrating an example of an SRAM circuit including inverters.

Hereinafter, one or more embodiments will be described in detail with reference to the accompanying drawings.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents, but also equivalents to be developed in the future, that is, all devices invented to perform the same functions regardless of the structures thereof. For example, a MOSFET described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, even if a certain step or operation of manufacturing an inventive apparatus or structure is described later than another step or operation, the step or operation may be performed later than the other step or operation unless the other step or operation is described as being performed after the step or operation.

One or more embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the one or more embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements to semiconductor devices may or may not be described in detail herein. However, even if a certain element is described or illustrated in a semiconductor device in this disclosure, the element may not be included in a claimed semiconductor device unless the element is recited as being included in the claimed semiconductor device.

FIG. 1 is a diagram illustrating an example of an SRAM circuit including inverters.

SRAM is a type of random-access memory that uses a latching circuitry to store one or more bits. Referring to FIG. 1, an SRAM circuit 100 includes six metal-oxide semiconductor field effect transistors (MOSFETs). The six MOSFETs are pull-up transistors PU1 110a and PU2 110b, pull-down transistors PD1 120a and PD2 120b, and pass-gate transistors PG1 130a and PG2 130b. Each bit in an SRAM is stored on four transistors of the PU1 110a, the PD1

120a, the PU2 110b and the PD2 120b that form two cross-coupled inverters. For example, the PU1 110a and PD1 120a form one inverter, and the PU2 110b and the PD2 120b form the other inverter. Two pass-gate transistors of the PG1 130a and the PG2 130b serve to control access to a memory cell formed of two cross-coupled inverters during read and write operations.

For a reading operation, a word line WL may be set to high (i.e., logic state "1") so as to activate access to the memory cell by the PG1 130a and the PG2 130b. By activating the word line WL, a value (i.e., "0" or "1") in the memory cell may be read through a bit line BL and/or a complementary bit line BLB. For example, if a logic state "1" is stored in the memory cell and when the word line WL turns on the PG1 130a and the PG2 130b, the bit line BL may read "1" and the complementary bit line BLB may read "0." During the writing operation, for example, if an instruction to write a "1" in the memory cell is to be executed, the word line WL may be set high to turn on the PG1 130a and the PG2 130b, and the bit line BL may be set to a high voltage to override the value "0" stored in the memory cell. Accordingly, one or more bits may be stored and accessed in the SRAM.

Figure 2A:
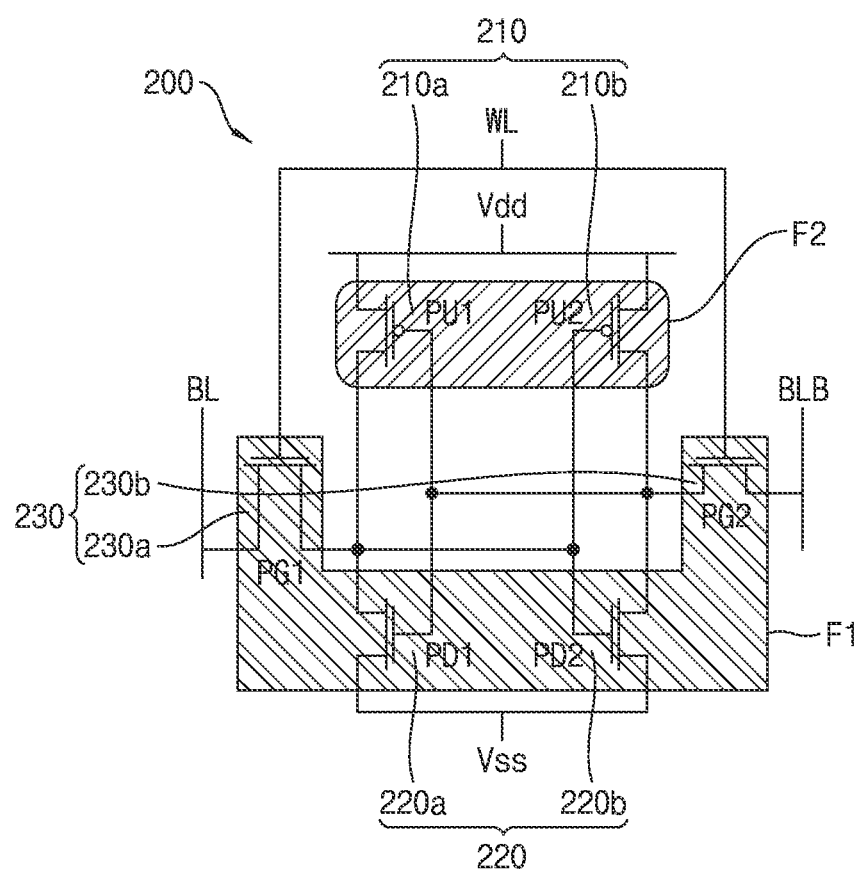
FIG. 2A is a diagram illustrating a cross-sectional view of a 3D stacked SRAM circuit.

FIG. 2A is a diagram illustrating a cross-sectional view of an SRAM circuit, according to an embodiment.

Referring to FIG. 2A, an SRAM circuit 200 may be structured such that a first pull-down transistor PD1 220a, a second pull-down transistor PD2 220b, a first pass-gate transistor PG1 230a and a second pass-gate transistor PG2 230b are disposed on a first layer F1 (also referred to as "a lower floor" "first stack" and/or "a first floor"), and a first pull-up transistor PU1 210a and a second pull-up transistor PU2 210b are disposed on a second layer F2 (also referred to as "an upper floor" "second stack" and/or "a second floor"). Here, the second layer F2 is formed above the first layer F1. In other words, the PU1 210a and PU2 210b transistors may be arranged above the PD1 220a, PD2 220b, PG1 230a and PG2 230b transistors. For example, the PU1 210a and the PU2 210b may be arranged directly above the PD1 220a and the PD2 220b, respectively, and the PG1 230a and the PG2 230b may be disposed adjacent to sides of the PD1 220a and the PD2 220b, respectively. That is, the PG1 230a may be disposed adjacent to the PD1 220a, and the PG2 230b may be disposed adjacent to the PD2 220b, where the pPG1 230a and the PG2 230b are disposed opposite from each other with respect to the PD1 220a and PD2 220b therebetween. However, the one or more embodiments are not limited thereto, and various arrangement of the transistors may be used.

Moreover, the PD1 220a, the PD2 220b, the PG1 230a and the PG2 230b may be n-type metal-oxide semiconductor (NMOS) transistors, and the PU1 210a and the PU2 210b may be a p-type metal-oxide semiconductor (PMOS) transistors. However, the one or more embodiments are not limited thereto, and other transistors and/or other circuit configurations may be used. In addition, as shown in FIG. 2A, the PU1 210a and the PU2 210b may be connected to a voltage source Vdd, and the PD1 220a and the PD2 220b may be connected to a voltage ground Vss.

According to the SRAM circuit 200 shown in FIG. 2A, by placing pull-up transistors (e.g., two (2) PMOS transistors) above pull-down transistors and pass-gate transistors (e.g., four (4) NMOS transistors), the size of an area required to place all the transistors for the SRAM circuit may be reduced while maintaining the performance and functionality of the SRAM.

Figure 2B:
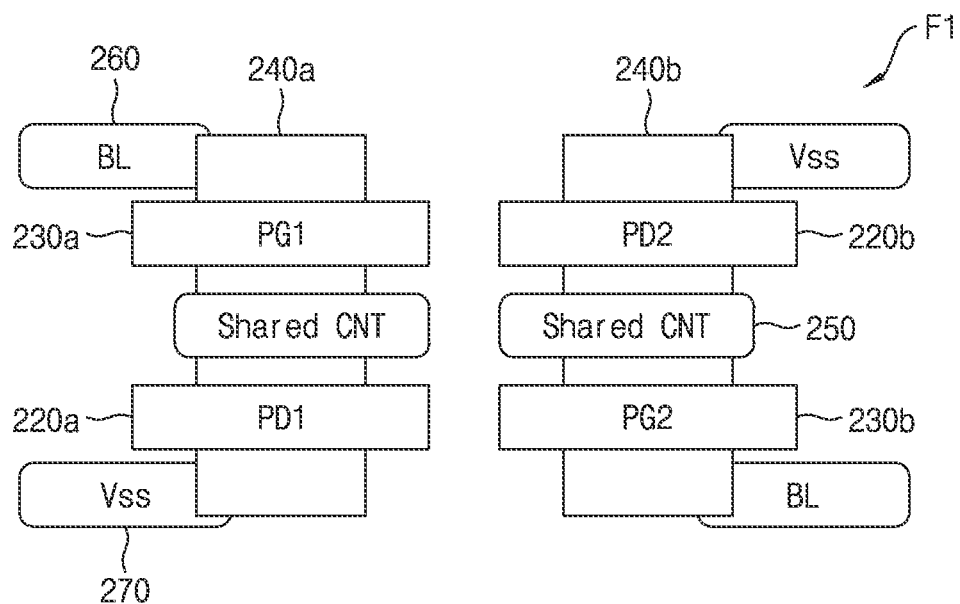
FIG. 2B is a diagram illustrating a top view of a first layer of the 3D stacked SRAM circuit shown in FIG. 2A.

FIG. 2B is a diagram illustrating a top view of a first layer of the 3D stacked SRAM circuit shown in FIG. 2A, according to an embodiment.

Referring to FIG. 2B, the first layer F1 of the 3D stacked SRAM may include the first pull-down gate transistor PD1 220a, the second pull-down gate transistor PD2 220b, the first pass-gate transistor PG1 230a, and the second pass-gate transistor PG2 230b. The first layer F1 may also include a first channel 240a that passes through a gate of the PD1 220a and a gate of the PG1 230a, and a second channel 240b that passes through a gate of the PD2 220b and a gate of the PG2 230b. While not shown in FIG. 2B, the first channel 240a and the second channel 240b may pass through gaps or holes formed in the respective gates of the PG1 230a, the PG2 230b, the PD1 220a and the PD2 220b. However, the one or more embodiments are not limited thereto, and the first channel 240a and the second channel 240b may be disposed above or below the respective gates. A channel described herein may include a source region and a drain region of a transistor.

The first layer F1 may also include shared contacts (CNT) 250 connected to upper surfaces of the first channel 240a and the second channel 240b. For example, a first shared CNT 250 may be disposed on an upper surface of the first channel 240a and between a gate of the PG1 230a and a gate of the PD 220a. A second shared CNT 250 may be disposed on an upper surface of the second channel 240b and between the PD2 220b and the PG2 230b. The shared CNTs 250 may be a conductor formed of a conducting material, such as aluminum (Al), tungsten (W), silver (Ag), tin (Sn), gold (Au), nickel (Ni), lead (Pb), titanium (Ti), or alloys thereof. However, the material of shared CNT 250 is not limited thereto, and may include any other material that is capable of conducting electricity.

The first layer F1 may include a bit line 260 that is connected to one end of the first channel 240a, and a voltage ground Vss 270 that is connected to the other end of the first channel 240a. For example, a source of the PG1 230a may be connected to the bit line BL 260, and a drain of the PG1 230a may be connected to a drain of the PD1 220a. A source of the PD1 220a may be connected to the voltage ground Vss 270. Also, a drain of the PG1 230a and the drain of the PD1 220a may be connected to the shared CNT 250. Similarly, another voltage ground Vss 270 may be connected to one end of the second channel 240b, and another bit line BL (e.g., a complementary bit line) may be connected to the other end of the second channel 240b. For example, a source of the PG2 230b may be connected to another bit line BL, and a drain of the PG2 230b may be connected to a drain of the PD2 220b. A source of the PD2 220b may be connected to another voltage ground Vss 270. Also, the drain of the PD2 220b and the drain of the PG2 may be connected to the shared CNT 250. While two separate voltage ground Vss 270 are illustrated in FIG. 2B such that one voltage ground Vss is connected to the first channel 240a, and the other voltage ground Vss is connected to the second channel 240b, it should be understood that these two voltage ground Vss 270 may be the same or a single voltage ground Vss, as shown in FIG. 2A.

Although the example configurations of source and drain of each transistor (e.g., the PD1 220a, the PD2 220b, the PG1 230a and PG2 230b) are described above, the one or more embodiments are not limited thereto, and may include different configurations depending on the type of transistor used for the SRAM circuit.

Figure 2C:
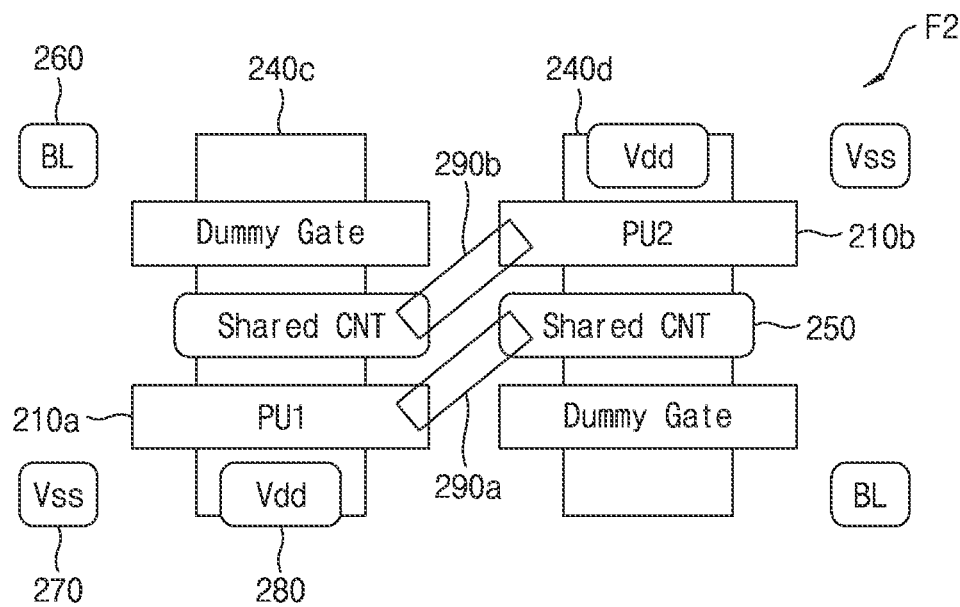
FIG. 2C is a diagram illustrating a top view of a second layer of the 3D stacked SRAM circuit shown in FIG. 2A.

FIG. 2C is a diagram illustrating a top view of a second layer of the 3D stacked SRAM circuit shown in FIG. 2A.

Referring to FIG. 2C, the second layer F2 of the 3D stacked SRAM circuit may include a first pull-up transistor PU1 210a, a second pull-up transistor PU2 210b, a third channel 240c and a fourth channel 240d. The third channel 240c may pass through a gate of the PU1 210a and a dummy gate. The fourth channel 240d may pass through a gate the PU2 210b and another dummy gate. Here, the third channel 240c and the fourth channel 240d may be disposed above the first channel 240a and the second channel 240b shown in FIG. 2B, respectively. In other words, the third channel 240c and the fourth channel 240d in the second layer F2 are arranged vertically above the first channel 240a and the second channel 240b in the first layer F1. The dummy gates may be formed such that they are physically connected to the third channel 240c and the fourth channel 240d. However, the dummy gates may not be electrically connected to any of the shared CNT 250, cross-couple contacts 290 and/or any other gates.

The second layer F2 may include the shared CNTs 250 disposed on the third channel 240c and the fourth channel 240d. However, the one or more embodiments are not limited thereto, and the shared CNTs 250 may extend from the first layer F1 to the second layer F2. In other words, the shared CNTs 250 may extend vertically in a z-direction (i.e., a direction going into and out of the paper). Each of the shared CNTs 250 may be connected to a gate of the PU1 210a and a gate of the PU2 210b by a first cross-couple contact 290a and a second cross-couple contact 290b, respectively. The first cross-couple contact 290a and the second cross-couple contact 290b may be collectively referred to as "cross-couple contacts 290." For example, a first shared CNT 250 disposed on the third channel 240c may be connected to the gate of the PU2 210b through the second cross-couple contact 290b, and a second shared CNT 250 disposed on the fourth channel 240d may be connected to the gate of the PU1 210a through the first cross-couple contact 290a. Here, the first cross-couple contact 290a and the second cross-couple contact 290b may be disposed diagonally with respect to the shared CNT 250 and the gates of the PU1 210a and the PU2 210b. The cross-couple contacts 290 may be conductors formed of a conducting material, such as aluminum (Al), tungsten (W), silver (Ag), tin (Sn), gold (Au), nickel (Ni), lead (Pb), titanium (Ti), or alloys thereof. In addition, the cross-couple contacts 290 may not be electrically connected to or may not be in physical contact with the dummy gates to prevent cross-coupled gates (e.g., a first inverter including the PU1 210a and the PD1 220a and a second inverter including the PU2 210b and the PD2 220b) being short-circuited.

One end of the third channel 240c may be connected to a voltage source Vdd, and one end of the fourth channel 240d may be connected to a voltage source Vdd. For example, a source of the PU1 210a may be connected to the voltage source Vdd and a source of the PU2 210b may be connected to the voltage source Vdd. In addition, the voltage source Vdd may be disposed on upper surfaces of the third channel 240c and the fourth channel 240d in the second layer F2 of the 3D stacked SRAM circuit. While the voltage sources Vdd are illustrated in FIG. 2C such that one voltage source Vdd is connected to the third channel 240c, and the other voltage source Vdd is connected to the fourth channel 240d, it should be understood that these voltage sources Vdd may be the same voltage source Vdd as shown in FIG. 2A.

In FIG. 2C, the bit lines BL 260 and the voltage ground Vss 270 may be seen from a top view of the second layer F2, but the bit lines BL 260 and the voltage ground Vss 270 are not connected to any of the elements in the second layer F2. For example, the bit line BL 260 and the voltage ground Vss 270 are not connected to the third channel 240c and the fourth channel 240d in the second layer F2. As described above with reference to FIG. 2B, the bit lines BL 260 and the voltage ground Vss 270 are connected to the first channel 240a and the second channel 240b in the first layer F1 of the 3D stacked SRAM circuit, but the bit lines BL 260 and the voltage ground Vss 270 may be seen from the top view of the second layer F2.

Figure 3A:
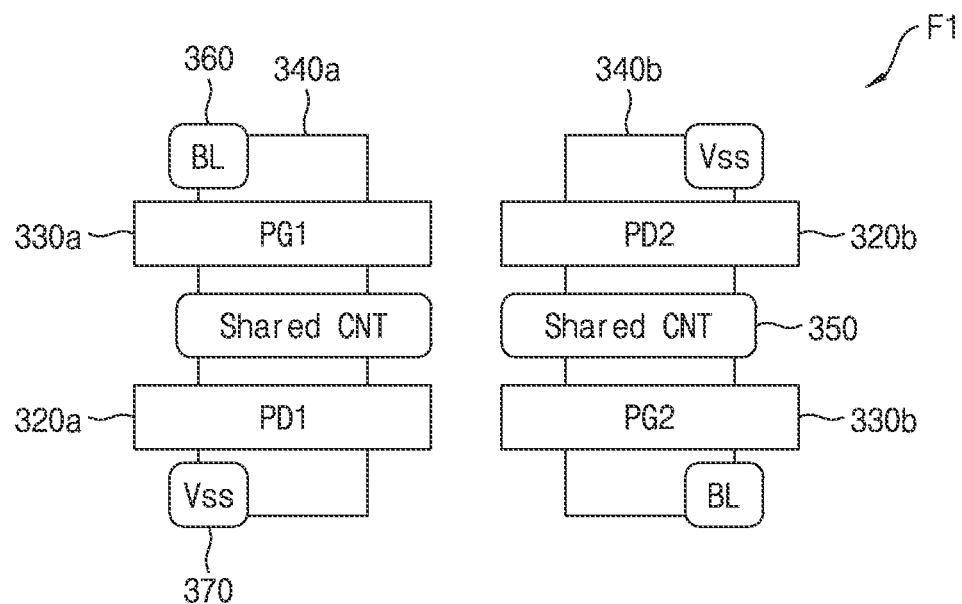
FIG. 3A is a top view illustrating a first layer of a 3D stacked SRAM circuit according to an embodiment.

FIG. 3A is a top view illustrating a first layer of a 3D stacked SRAM circuit according to an embodiment. The first layer F1 of the 3D stacked SRAM circuit according to this embodiment is similar to the first layer F1 of the 3D stacked SRAM circuit shown in FIG. 2B. Therefore, the descriptions of the same or similar elements provided above with reference to FIG. 2B may be omitted.

Referring to FIG. 3A, the first layer F1 of the 3D stacked SRAM circuit according to an embodiment may include a first pass-gate transistor PG1 330a, a second pass-gate transistor PG2 330b, a first pull-down transistor PD1 320a, a second pull-down transistor PD2 320b, a first channel 340a and a second channel 340b. A first shared CNT 350 may be disposed on the first channel 340a and between a gate of the PG1 330a and a gate of the PD1 320a. A second shared CNT 350 may be disposed on the second channel 340b and between a gate of the PD2 320b and a gate of the PG2 330b.

According to an embodiment, bit lines BL 360 may be connected to at least one surface of the first channel 340a and at least one surface of the second channel 340b, and a voltage ground Vss may be connected to at least one surface of the first channel 340a and at least one surface of the second channel 340b. In contrast to FIG. 2B, the bit lines BL 360 and the voltage ground Vss 370 may be smaller than the bit lines BL 260 and the voltage ground Vss 270 of FIG. 2B. A detailed description of the smaller bit lines BL 360 and the voltage ground Vss 370 will be described below with reference to FIG. 3B.

Figure 3B:
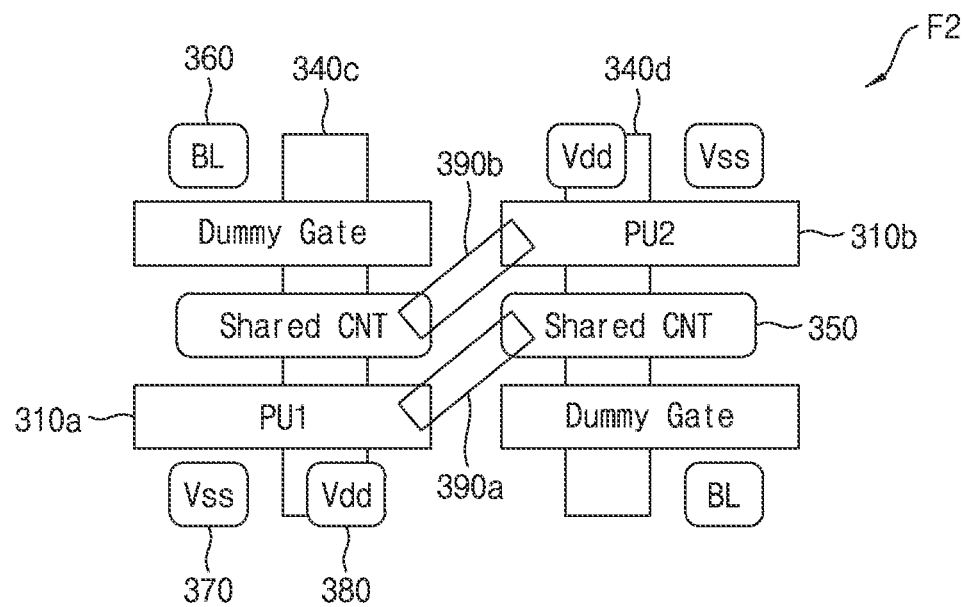
FIG. 3B is a top view illustrating a second layer of a 3D stacked SRAM circuit according to an embodiment.

FIG. 3B is a top view illustrating a second layer of a 3D stacked SRAM circuit according to an embodiment. The second layer F2 of the 3D stacked SRAM circuit according to this embodiment is similar to the second layer F2 of the 3D stacked SRAM circuit shown in FIG. 2C. Therefore, the descriptions of the same or similar elements provided above with reference to FIG. 2C may be omitted.

Referring to FIG. 3B, the second layer F2 of the 3D stacked SRAM circuit according to an embodiment may include a first pull-up transistor PU1 310a, a second pull-up transistor PU2 310b, a third channel 340c and a fourth channel 340d. Here, the widths of the third channel 340c and the fourth channel 340d in the second layer F2 are formed to be smaller than the widths of the first channel 340a and the second channel 340b in the first layer F1 shown in FIG. 3A, respectively. For example, the widths of the third channel 340c and the fourth channel 340d may be smaller than the widths of the first channel 340a and the second channel 340b by at least 10 nanometers (nm). That is, the width of the third channel 340c in the second layer F2 may be smaller than the width of the first channel 340a in the first layer F1 by at least 10 nm, and the width of the fourth channel 340d in the second layer F2 may be smaller than the width of the second channel 340b in the second layer F2 by at least 10 nm.

Because the widths of the channels in the second layer F2 (i.e., upper layer) are smaller than the widths of the channels in the first layer F1 (i.e., lower layer), it allows a more space to deposit the bit lines BL 360 and the voltage ground Vss 370 on the first layer F1 through the empty space of the second layer F2. That is, by reducing the widths of the third channel 240c and the fourth channel 240d in FIG. 2B, portions of the second layer F2 are no longer occupied by the third channel 340c and the fourth channel 340d. This allows the bit lines BL 360 and the voltage ground Vss 370 to be deposited on the first channel 340a and the second channel 340b of the first layer F1 through the vacant space in the second layer F2. Accordingly, a width of the bit lines BL 360 in this embodiment may be smaller than a width of the bit lines BL 260 shown in FIG. 2B. Similarly, a width of the voltage ground Vss 370 in this embodiment may be smaller than a width of the voltage ground Vss 270 shown in FIG. 2B. Here, the voltage ground Vss may be a voltage ground line or a voltage ground contact disposed on the upper surface of the first channel 340a and the second channel 340b in the first layer F1. Therefore, the size of the 3D stacked SRAM may be reduced, thereby optimizing areal density and performance of the 3D stacked SRAM.

Figure 4A:
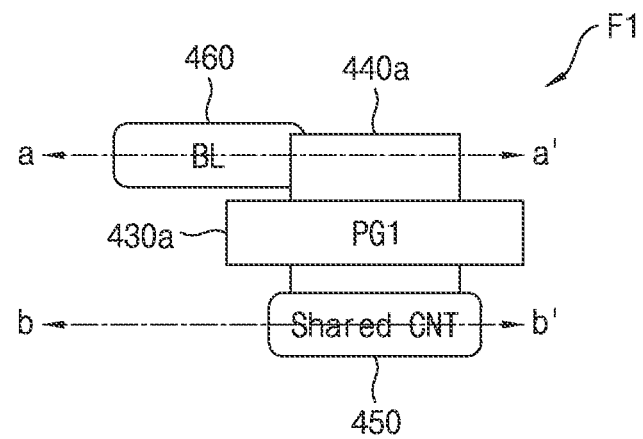
FIG. 4A is a top view illustrating a portion of the first layer of the 3D stacked SRAM circuit shown in FIG. 2B.

FIG. 4A is a top view illustrating a portion of the first layer of the 3D stacked SRAM circuit shown in FIG. 2B, according to an embodiment.

Referring to FIG. 4A, the first layer F1 may include a first channel 440a that passes through a gate of a pass-gate transistor PG1 430a, a shared CNT 450 disposed on the first channel 440a, and a bit line BL 460 connected to the first channel 440a. Here, the bit line BL 460 is connected to a side surface of the first channel 440a. The portion of the first layer F1 shown in FIG. 4A is described above with reference to FIG. 2B, therefore, a detailed description of the first layer F1 will be omitted.

Figure 4B:
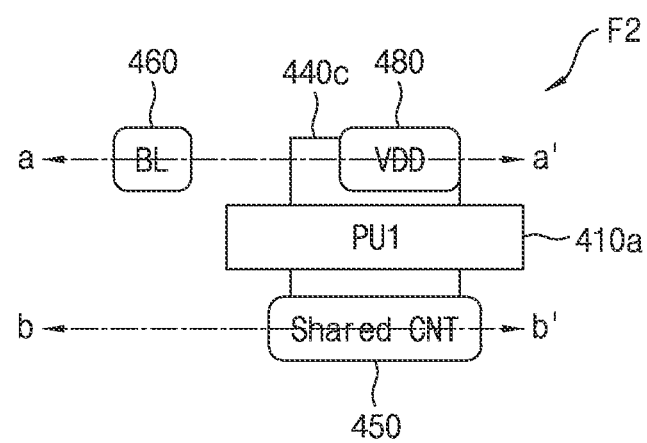
FIG. 4B is a top view illustrating a portion of the second layer of the 3D stacked SRAM circuit shown in FIG. 2C.

FIG. 4B is a top view illustrating a portion of the second layer of the 3D stacked SRAM circuit shown in FIG. 2C, according to an embodiment.

Referring to FIG. 4B, the second layer F2 may include a third channel 440c that passes through a gate of a pull-up transistor PU1 410a, a voltage source Vdd disposed on one end of the third channel 440c, and the shared CNT 450 disposed on the other end of the third channel 440c. Here, the shared CNT 450 of the second layer F2 may extend from the shared CNT 450 of the first layer F1 shown in FIG. 4A. However, the one or more embodiments are not limited thereto, and one or more shared CNTs 450 may be separately or independently disposed on the first layer F1 and the second layer F2. The portion of the second layer F2 shown in FIG. 4B is described above with reference to FIG. 2C, therefore, a detailed description of the second layer F2 will be omitted.

Figure 4C:
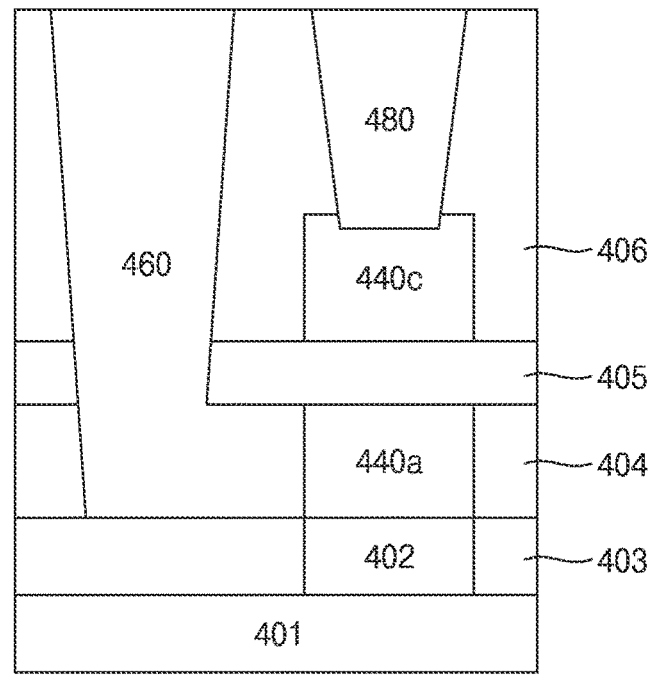
FIG. 4C is a cross-sectional view illustrating a 3D stacked SRAM circuit, taken along the line a-a' shown in FIG. 4B.

FIG. 4C is a cross-sectional view illustrating a 3D stacked SRAM circuit, taken along the line a-a' shown in FIG. 4B, according to an embodiment.

Referring to FIG. 4C, the 3D stacked SRAM circuit may include an active region 401, a first dielectric 402, a second dielectric 403, a third dielectric 404, a first channel 440a, a third channel 440c, a fourth dielectric 405, a fifth dielectric 406, a bit line BL 460 and a voltage source Vdd 480.

The active region 401 may include a silicon substrate and formed at the bottommost layer of the 3D stacked SRAM. The first dielectric 402 may be disposed on a portion of an upper surface of the active region 401. The second dielectric 403 may be disposed on a portion of the upper surface of the active region 401 that is not occupied by the first dielectric 402. The first dielectric 402 may be formed between the first channel 440a and the active region 401 to isolate the active region 401 from the first channel 440a. The second dielectric 403 is also formed to isolate the active region 401 from the bit line BL 460. The third dielectric 404 may be disposed on a portion of an upper surface of the second dielectric 403, and may surround a portion of the first channel 440a and a portion of the bit line BL 460. Here, the bit line BL 460 may have an "L" shape, and one end of the bit line BL 460 may be connected to a side surface of the first channel 440a. The fourth dielectric 405 may be disposed on the first channel 440a such that the fourth dielectric 405 is formed between the first channel 440a and the third channel 440c, thereby isolating the first channel 440a in the first layer F1 from the third channel 440c in the second layer F2. The fourth dielectric 405 may also be disposed such that it covers a portion of an upper surface of the third dielectric 404. The fifth dielectric 406 may be disposed on the fourth dielectric 405, and may surround the third channel 440c in the second layer F2. The voltage source Vdd 480 may be disposed on an upper surface of the third channel 440c, and extend vertically from the upper surface of the third channel 440c. In addition, the fifth dielectric 406 may be disposed such that it surrounds portions of the bit line BL 460 and the voltage source Vdd 480.

The first dielectric 402, the second dielectric 403, the third dielectric 404, the fourth dielectric 405 and the fifth dielectric 406 may be formed of different materials. For example, a dielectric material for the first dielectric 402 to the fifth dielectric 406 may include silicon oxide (SiO), silicon nitride (SiN), carbon nitride (C3N4), aluminum nitride (AlN), etc. However, the dielectric material is not limited thereto, and may include any other material that is capable of insulating conductors.

In the 3D stacked SRAM circuit shown in FIG. 4C, the bit line BL 460 is required to make a lateral interconnection with the first channel 440a (e.g., source and drain of the PG1 430a). However, this type of lateral interconnection is difficult to be formed by the conventional contact processing techniques, such as lithography, dry reactive-ion etching (RIE), and metal fill.

Figure 4D:
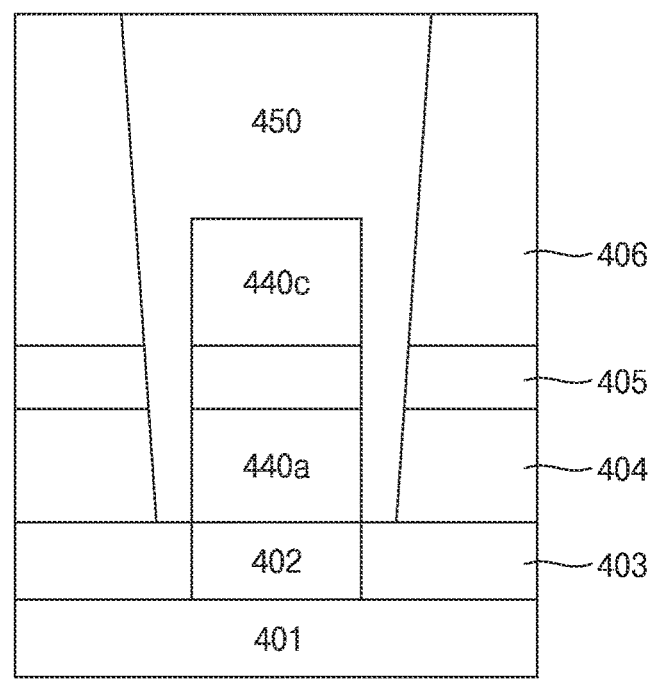
FIG. 4D is a cross-sectional view illustrating a 3D stacked SRAM circuit, taken along the line b-b' shown in FIG. 4B.

FIG. 4D is a cross-sectional view illustrating a 3D stacked SRAM circuit, taken along the line b-b' shown in FIG. 4B, according to an embodiment. FIG. 4D includes similar or the same structures shown in FIG. 4C, therefore, some of the repeated descriptions thereof will be omitted.

Referring to FIG. 4D, the active region 401 may be formed at the bottommost layer of the 3D stacked SRAM. The first dielectric 402 and the second dielectric 403 are disposed on the upper surface of the active region 401. The first dielectric 402 may be disposed between the active region 401 and the first channel 440a. The third dielectric 404 may be disposed on the upper surface of the second dielectric 403. The fourth dielectric 405 may be disposed on the upper surface of the first channel 440a, and the third channel 440c may be disposed on the upper surface of the fourth dielectric 405. Here, the fourth dielectric 405 is disposed between the first channel 440a and the third channel 440c to isolate the first channel 440a from the third channel 440c, or vice versa. A shared CNT 450 may be disposed such that the shared CNT 450 covers side surfaces of the first channel 440a and the third channel 440c and the upper surface of the third channel 440c. Also, the shared CNT 450 may cover side surfaces of a portion of the fourth dielectric 405 disposed between the first channel 440a and the third channel 440c. The fifth dielectric 406 may be disposed on the upper surface of the fourth dielectric 405 and surround the shared CNT 450.

As shown in FIGS. 4C and 4D, the L-shaped bit line BL 460, the voltage source Vdd 480 and the shared CNT 450 cover wider surfaces of the 3D stacked SRAM circuit. A more detailed description thereof will be provided below with reference to FIGS. 5A to 5D.

Although not shown in FIGS. 4A to 4D, it should be understood that the second channel and the fourth channel may form the same or similar structure shown with respect to the first channel 440a and the third channel 440c in FIGS. 4A to 4D.

In the 3D stacked SRAM circuit shown in FIG. 4D, the shared CNT 450 wraps around the third channel 440c (e.g., source and drain of the PU1 410a). However, the formation of the contacts wrapping around the upper channel of a transistor is difficult to be realized by conventional patterning techniques, such as lithography, dry RIE and metal fill. For example, the contacts wrapping the upper channel may require isotropic or selective wet etch and metal gap-fill with extreme uniformity. With such a technique, the shared CNT 450 may only laterally contact the first channel 440a (e.g., source and drain of the PG1 430a), which may dramatically increase contact resistance.

Figure 5A:
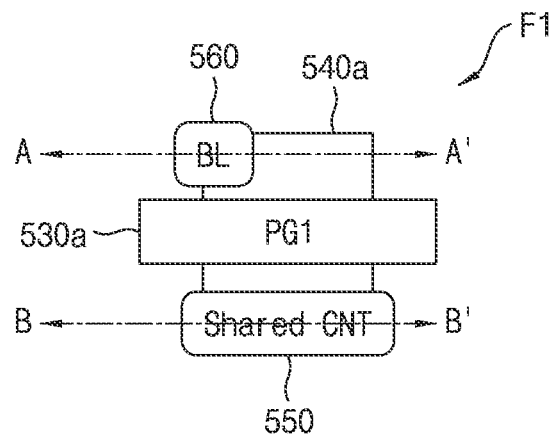
FIG. 5A is a top view illustrating a portion of the first layer of the 3D stacked SRAM circuit shown in FIG. 3A, according to an embodiment.

FIG. 5A is a top view illustrating a portion of the first layer of the 3D stacked SRAM circuit shown in FIG. 3A, according to an embodiment.

Referring to FIG. 5A, the first layer F1 may include a first channel 540a that passes through a gate of a pass-gate transistor PG1 530a, a shared CNT 550 disposed on the first channel 540a and a bit line BL 560 connected to the first channel 540a. Here, the bit line BL 560 is disposed on an upper surface of the first channel 540a. The portion of the first layer F1 shown in FIG. 5A is described above with reference to FIG. 3A, therefore, a detailed description of the first layer F1 will be omitted.

Figure 5B:
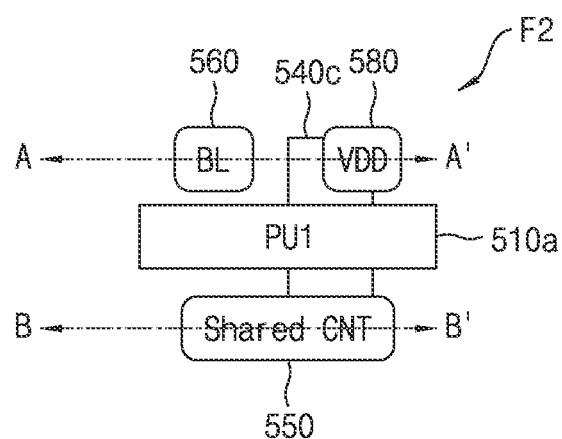
FIG. 5B is a top view illustrating a portion of the second layer of the 3D stacked SRAM circuit shown in FIG. 3B, according to an embodiment.

FIG. 5B is a top view illustrating a portion of the second layer of the 3D stacked SRAM circuit shown in FIG. 3B, according to an embodiment.

Referring to FIG. 5B, the second layer F2 may include a third channel 540c that passes through a gate of a pull-up transistor PU1 510a, the shared CNT 550, a bit line BL 560 and a voltage source Vdd 580. In contrast to the third channel 440c shown in FIG. 4B, the third channel 540c according to an embodiment may be smaller than the first channel 540a in the first layer F1. That is, the width of the third channel 540c in the second layer F2 may be smaller than the width of the first channel 540a in the first layer F1. For example, the width of the third channel 540c may be smaller than the width of the first channel 540a by at least 10 nm. When the width of the third channel 540c is smaller than the width of the first channel 540a, a certain space of the second layer F2 may be no longer be occupied by the third channel 540c, thereby creating a more space to dispose the bit line BL 560 on an upper surface of the first channel 540a of the first layer F1. Therefore, the bit line BL 560 may not need to make a lateral connection to the first channel 540a, and may be directly disposed on the upper surface of the first channel 540a of the first layer F1 through the unoccupied or vacant space in the second layer F2. Accordingly, a surface area occupied by the bit line BL 560 may be reduced in addition to the reduction of the surface area of the third channel 540c, thereby efficiently utilizing the areal space of the 3D stacked SRAM circuit.

Figure 5C:
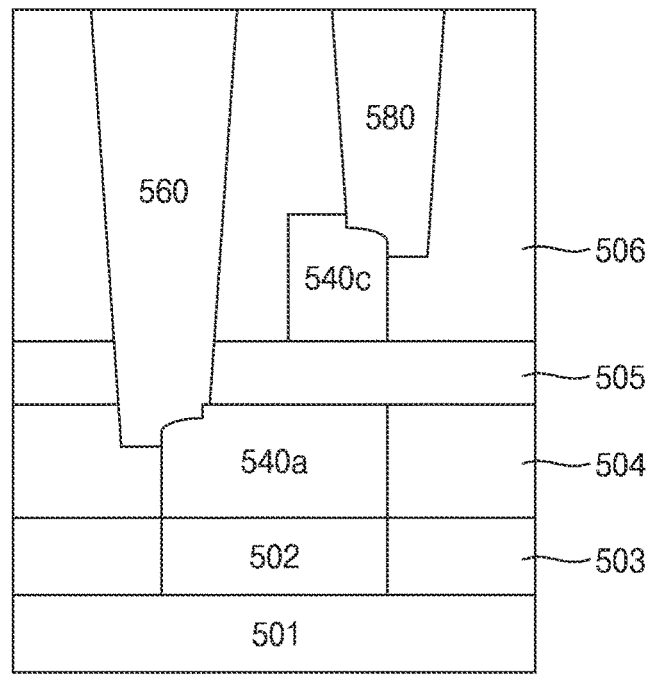
FIG. 5C is a cross-sectional view illustrating a 3D stacked SRAM circuit, taken along the line A-A' shown in FIG. 5B, according to an embodiment.

FIG. 5C is a cross-sectional view illustrating a 3D stacked SRAM circuit, taken along the line A-A' shown in FIG. 5B, according to an embodiment.

Referring to FIG. 5C, the 3D stacked SRAM circuit according to an embodiment may include a first channel 540a and a third channel 540c forming a nanosheet pin. The 3D stacked SRAM circuit may also include an active region 501, a first dielectric 502, a second dielectric 503, a third dielectric 504, a fourth dielectric 505, a fifth dielectric 506, a bit line BL 560 and a voltage source Vdd 580.

The active region 501 may include a silicon substrate and formed at the bottommost layer of the 3D stacked SRAM. The first dielectric 502 may be disposed on a portion of an upper surface of the active region 501. The second dielectric 503 may be disposed on a portion of the upper surface of the active region 501 that is not occupied by the first dielectric 502. The first dielectric 502 may be formed between the first channel 540a and the active region 501 to isolate the active region 501 from the first channel 540a. The second dielectric 503 is also formed to isolate the active region 501 from the bit line BL 560. The third dielectric 504 may be disposed on a portion of an upper surface of the second dielectric 503, and may surround a portion of the first channel 540a and a portion of the bit line BL 560.

The bit line BL 560 may be disposed directly on the first channel 540a. For example, as shown in FIG. 5C, the bit line BL 560 may be disposed such that it is connected to an upper corner surface of the first channel 540a forming an arc shape. However, the one or more embodiments are not limited thereto, and the bit line BL 560 may be disposed on the first channel 540a in various manners and shapes. For example, an upper surface of the first channel 540a may include an arc shape, a flat surface, a recess, etc. on which the bit line BL 560 may be disposed. A bottom surface of the bit line BL 560 may have a corresponding shape to the upper surface of the first channel 540a. The fourth dielectric 505 may be disposed on the first channel 540a such that at least a portion of the fourth dielectric 505 is disposed between the first channel 540a and the third channel 540c, thereby isolating the first channel 540a in the first layer F1 from the third channel 540c in the second layer F2. The fourth dielectric 505 may also be disposed such that it covers a portion of an upper surface of the third dielectric 504. The fifth dielectric 506 may be disposed on the fourth dielectric 505, and may surround the third channel 440c in the second layer F2.

The voltage source Vdd 580 may be disposed on an upper surface of the third channel 540c, and extend vertically from the upper surface of the third channel 540c. For example, the voltage source Vdd 580 may be connected to an upper corner surface of the third channel 540c forming an arc. However, the one or more embodiments are not limited thereto, and the voltage source Vdd 580 may be disposed on the third channel 540c in various manner and shapes. For example, an upper surface of the third channel 540c may include an arc shape, a flat surface, a recess, etc. on which the bit line BL 560 may be disposed. A bottom surface of the bit line BL 560 may have a corresponding shape to the upper surface of the third channel 540c. In addition, the fifth dielectric 506 may be disposed such that it surrounds portions of the bit line BL 560 and the voltage source Vdd 580.

The first dielectric 502, the second dielectric 503, the third dielectric 504, the fourth dielectric 505 and the fifth dielectric 506 may be formed of different materials. For example, a dielectric material for the first dielectric 502 to the fifth dielectric 506 may include silicon oxide (SiO), silicon nitride (SiN), carbon nitride (C3N4), aluminum nitride (AlN), etc. However, the dielectric material is not limited thereto, and may include any other material that is capable of insulating conductors.

As described above with reference to FIGS. 5A and 5B, the third channel 540c (i.e., an upper channel in the second layer F2) may have a width that is smaller than that of the first channel 540a. As shown in FIG. 5C, the width of the third channel 540c is smaller than the width of the first channel 540a, thereby forming a nanosheet pin like structure. In contrast to the 3D stacked SRAM circuit shown in FIG. 4C, since the width of the third channel 540c is smaller than the width of the first channel 540a, it allows a vacant or extra space to be formed in the second layer F2 and above the upper surface of the first channel 540a. The bit line BL 560 may be deposited through this space to form an active contact directly on the upper surface of the first channel 540a, thereby optimizing the areal space of the 3D stacked SRAM circuit. Also, the bit line BL 560 does not need to form a lateral interconnection to a side surface of the first channel 540a, thereby making the manufacturing process easier and simpler even using the conventional contact processing techniques, such as lithography, dry reactive-ion etching (RIE), and metal fill.

Figure 5D:
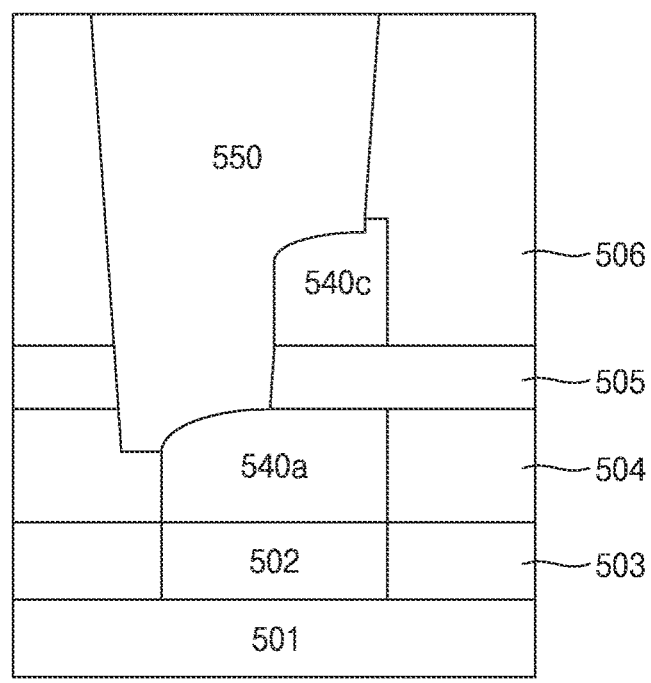
FIG. 5D is a cross-sectional view illustrating a 3D stacked SRAM circuit, taken along the line B-B' shown in FIG. 5B, according to an embodiment.

FIG. 5D is a cross-sectional view illustrating a 3D stacked SRAM circuit, taken along the line B-B' shown in FIG. 5B, according to an embodiment. FIG. 5D includes similar or the same structures shown in FIG. 5C, therefore, some of the repeated descriptions thereof will be omitted.

Referring to FIG. 5D, the 3D stacked SRAM circuit may include the active region 501, the first dielectric 502, the second dielectric 503, the third dielectric 504, the first channel 540a, the fourth dielectric 505, the third channel 540c, the fifth dielectric 506 and a shared CNT 550.

According to an embodiment, the active region 501 may be formed at the bottommost layer of the 3D stacked SRAM circuit. The first dielectric 502 and the second dielectric 503 are disposed on the upper surface of the active region 501. The first dielectric 502 may be disposed between the active region 501 and the first channel 540a. The third dielectric 504 may be disposed on the upper surface of the second dielectric 503. The fourth dielectric 505 may be disposed on the upper surface of the first channel 540a, and the third channel 540c may be disposed on the upper surface of the fourth dielectric 505. Here, the fourth dielectric 505 is disposed between the first channel 540a and the third channel 540c to isolate the first channel 540a from the third channel 540c. The shared CNT 550 may be disposed such that the shared CNT 550 covers portions of the first channel 540a and the third channel 540c. For example, as shown in FIG. 5D, the shared CNT 550 may be disposed on an upper corner surface of the first channel 540a forming an arc shape, and the shared CNT 550 may be disposed on an upper corner surface of the third channel 540c forming an arc shape. The shared CNT 550 may penetrate through the fourth dielectric 505 and cover side surfaces of a portion of the fourth dielectric 505 disposed between the first channel 540a and the third channel 540c. However, the one or more embodiments of the disclosure are not limited thereto, and the shared CNT 550 may be connected to the first channel 540a and the third channel 540c in any other manner and shape. For example, a shape of the shared CNT 550 that contacts the first channel 540a and the third channel 540c may be in a rectangular shape or a pin shape that may be inserted to the respective channels. The fifth dielectric 506 may be disposed on the upper surface of the fourth dielectric 505 and surround the shared CNT 550 and the third channel 540c.

As shown in FIGS. 5C and 5D, the bit line BL 560, the voltage source Vdd 580 and the shared CNT 550 are configured such that they occupy a less space in the 3D stacked SRAM circuit, compared to the L-shaped bit line BL 460, the voltage source Vdd 480 and the shared CNT 450 shown in FIGS. 4C and 4D.

Specifically, compared to the shared CNT 450 shown in FIG. 4D, the shared CNT 550 according to this embodiment may be connected to both the first channel 540a of the first layer F1 and the third channel 540c of the second layer F1 by depositing the shared CNT 550 on the empty space formed by reducing the width of the third channel 540c. Also, the shared CNT 550 does not cover both side surfaces of the first channel 540a and the third channel 540c, thereby optimizing the areal space of the 3D stacked SRAM circuit.

Although not shown in FIGS. 5A to 5D, it should be understood that the second channel and the fourth channel may form the same or similar structure shown with respect to the first channel 540a and the third channel 540c in FIGS. 5A to 5D.

Figure 6A:
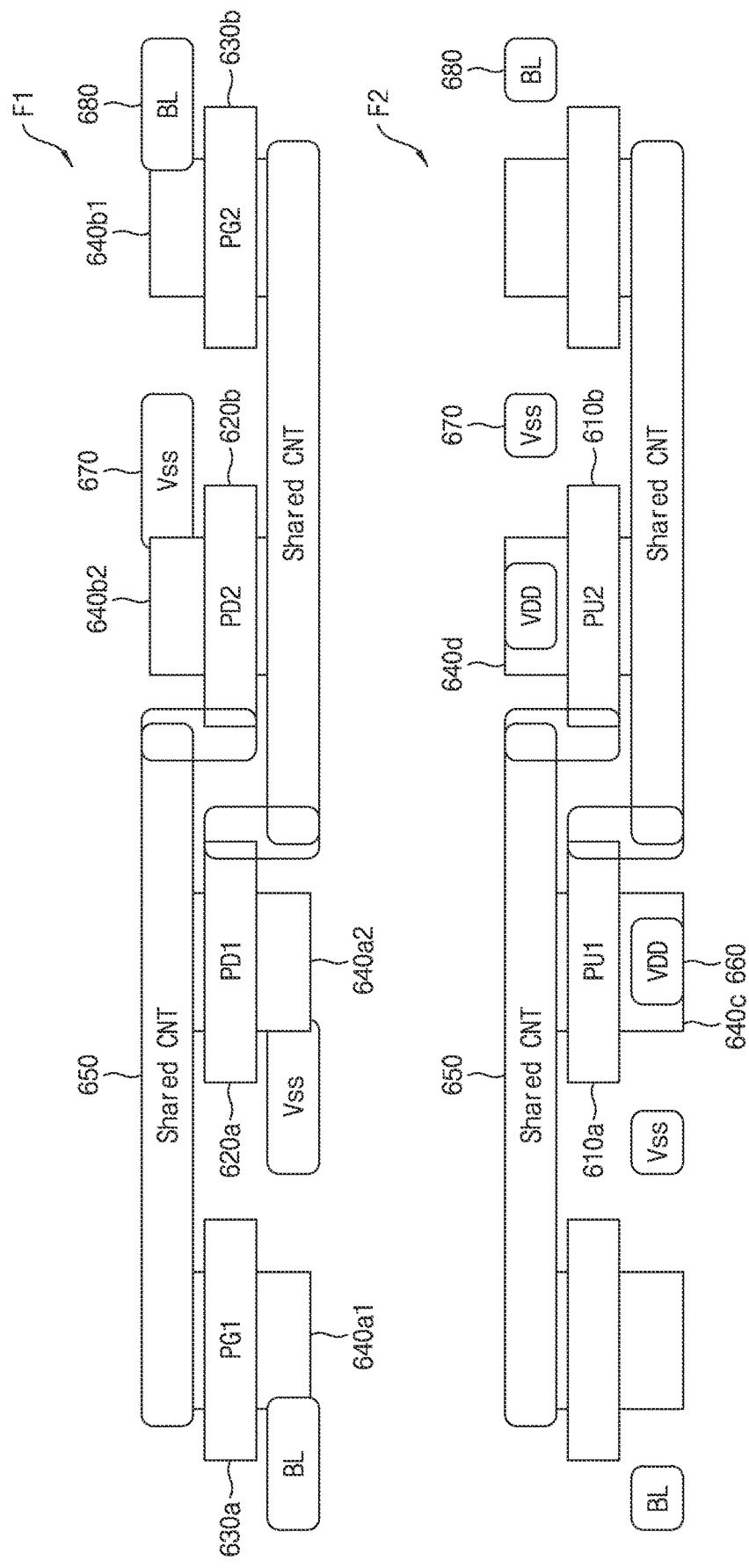
FIG. 6A is a top view illustrating a first layer and a second layer of a 3D stacked SRAM circuit.

FIG. 6A is a top view illustrating a first layer and a second layer of a 3D stacked SRAM circuit, according to an embodiment. The upper circuit configuration of FIG. 6A shows the first layer F1 (or the lower layer), and the lower circuit configuration of FIG. 6A shows the second layer F2 (or the upper layer). Although not shown in FIG. 6A, the second layer F2 may be disposed above the first layer F1.

Referring to FIG. 6A, the first layer F1 of the 3D stacked SRAM circuit may include a first pass-gate transistor PG1 630a, a first pull-down transistor PD1 620a, a second pull-down transistor PD2 620b and a second pass-gate transistor PG2 630b. The PG1 630a, the PD1 620a, the PD2 620b and the PG2 630b includes a first channel 640a1, a second channel 640a2, a third channel 640b1 and a fourth channel 640b2, respectively. It should be understood that the first channel 640a1 and the second channel 640a2 correspond to the first channel 240a shown in FIG. 2B, and the third channel 640b1 and the fourth channel 640b2 correspond to the second channel 240b shown in FIG. 2A. That is, each of the first channel 240a and the second channel 240b of FIG. 2B is separated into two channels in FIG. 6A.

The first channel 640a1, the second channel 640a2, and a gate of the PD2 620b may be connected through a shared CNT 650. The third channel 640b2, the fourth channel 640b1, and a gate of the PD1 620a may be connected through the shared CNT 650. A bit line BL 680 may be connected to each of the first channel 640a1 and the fourth channel 640b1. For example, one end of the first channel 640a1 may be connected to the bit line BL 680, and the other end of the first channel 640a1 may be connected to the shared CNT 650. Here, each end of the first channel 640a1 may be a source region and a drain region of the PG1 630a. A voltage ground Vss 670 may be connected to each of the second channel 640a2 and the third channel 640b2. For example, one end of the second channel 640a2 may be connected to the voltage ground Vss 670, and the other end of the second channel 640a2 may be connected to the shared CNT 650. Here, each end of the second channel 640a2 may be a source region and a drain region of the PD1 620a. Also, the voltage ground Vss 670 connected to the second channel 640a2 and the third channel 640b2 may be the same voltage ground.

The second layer F2 of the 3D stacked SRAM circuit may include a first pull-up transistor PU1 610a including a fifth channel 640c and a second pull-up transistor PU2 610b including a sixth channel 640d. Here, one end of the fifth channel 640c may be connected to a gate of the PU2 610b and the other end of the fifth channel 640c may be connected to a voltage source Vdd 660 through the shared CNT 650. Each end of the fifth channel 640c may be a source region and a drain region of the PU1 610a. Also, one end of the sixth channel 640d may be connected to a gate of the PU1 610a, and the other end of the sixth channel 640d may be connected to the voltage source Vdd 660 through the shared CNT 650. Each end of the sixth channel 640d may be a source region and a drain region of the PU2 610b. The shared CNT 650 in the second layer F2 may extend from the first layer F1. However, the one or more embodiments are not limited thereto. Also, the voltage source Vdd 660 connected to each of the fifth channel 640*c* and the sixth channel 640*d* may be the same voltage source.

Figure 6B:
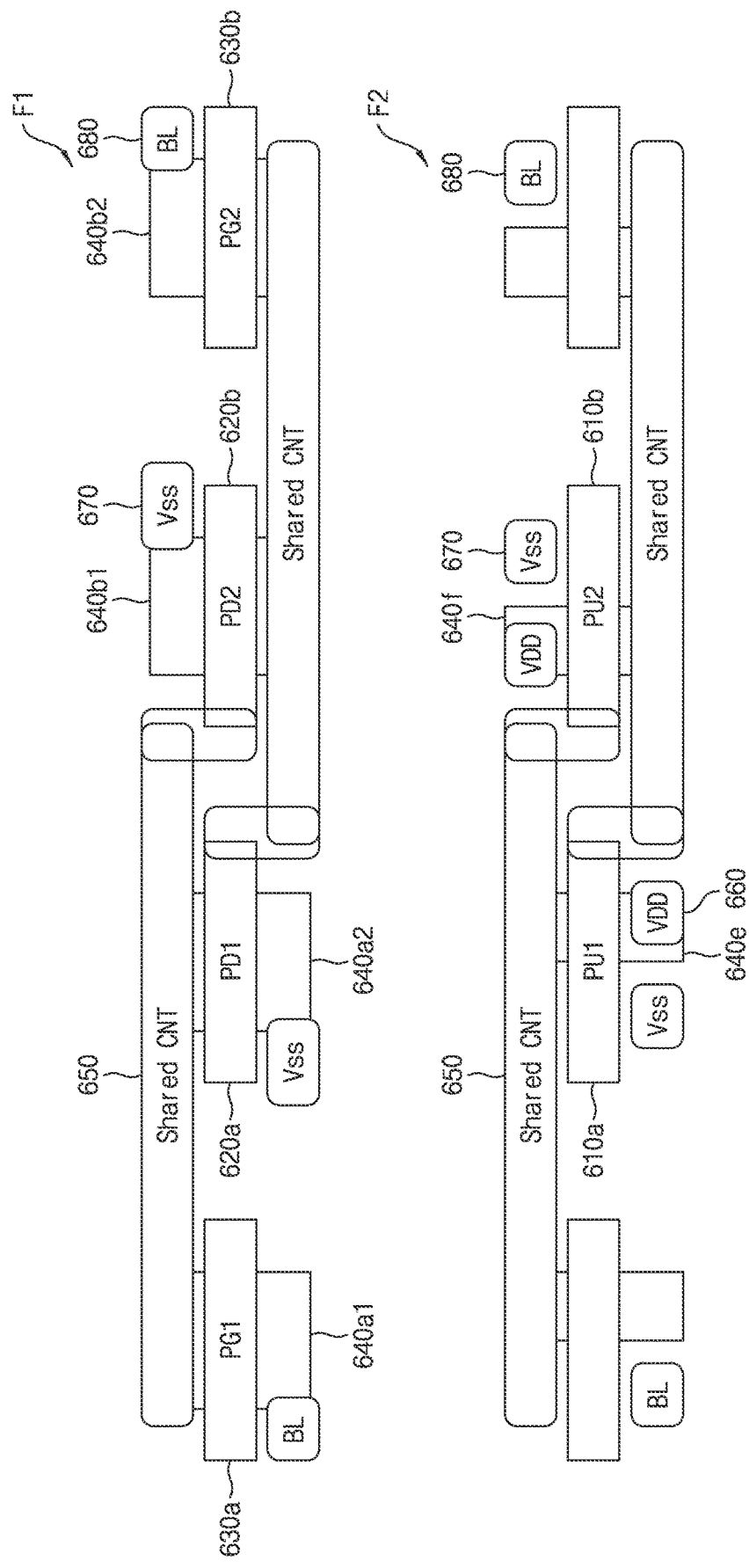
FIG. 6B is a top view illustrating a first layer and a second layer of a 3D stacked SRAM circuit according to an embodiment.

FIG. 6B is a top view illustrating a first layer and a second layer of a 3D stacked SRAM circuit, according to an embodiment. FIG. 6B includes similar or the same structures shown in FIG. 6A, therefore, some of the repeated descriptions thereof will be omitted.

Referring to FIG. 6B, the first layer F1 of the 3D stacked SRAM circuit according to an embodiment may include the similar structure shown in the first layer F1 of FIG. 6A. However, the bit line BL 680 according to this embodiment may be disposed directly on upper surfaces of the first channel 640*a*1 and the fourth channel 640*b*2. In addition, a surface area of the bit line BL 680 according to this embodiment may be smaller than that of a surface area of the bit line BL 680 in FIG. 6A.

The second layer F2 of the 3D stacked SRAM circuit according to an embodiment may include a fifth channel 640*e* and a sixth channel 640*f*. Here, the width of the fifth channel 640*e* may be smaller than the width of the fifth channel 640*c* shown in FIG. 6A. Similarly, the width of the sixth channel 640*f* may be smaller than the width of the sixth channel 640*d* shown in FIG. 6A. As such, the voltage ground Vss 670 according to this embodiment may be disposed directly on upper surfaces of the second channel 640*a*2 and the third channel 640*b*1 through vacant spaces in the second layer F2 formed as a result of the reduced widths of the fifth channel 640*e* and the sixth channel 640*f*.

By reducing the channel widths and active contact areas (e.g., the bit line BL and the voltage ground Vss), the areal density the 3D stacked SRAM may be optimized, and the performance of the 3D stacked SRAM may be enhanced because the areal optimization allows more room to place more transistors.

Figure 7:
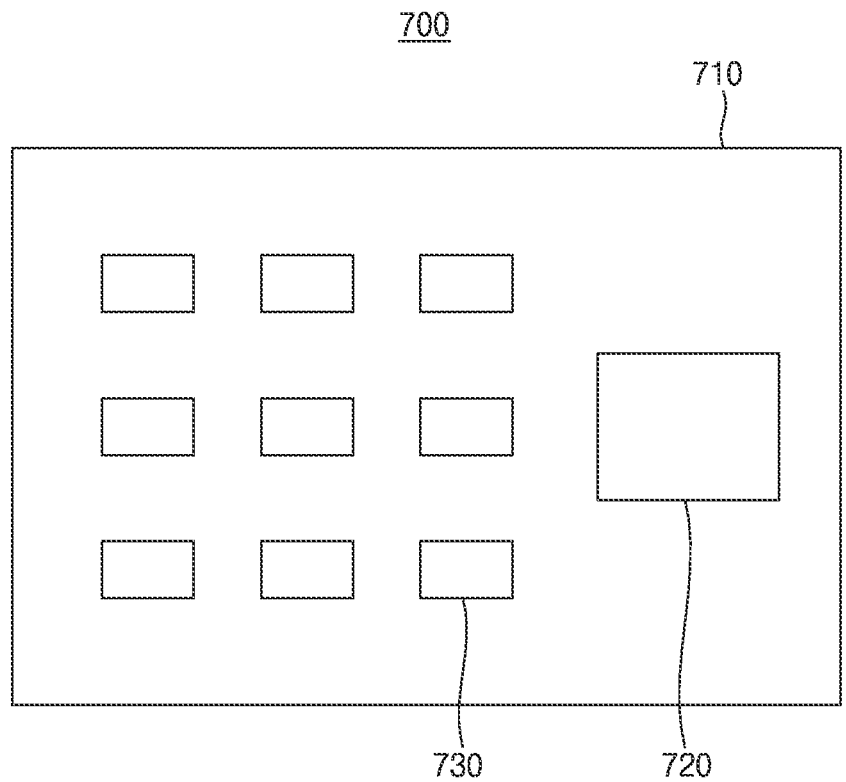
FIG. 7 is a diagram illustrating a schematic plan view of a semiconductor module according to an embodiment.

FIG. 7 is a diagram illustrating a schematic plan view of a semiconductor module according to an embodiment.

Referring to FIG. 7, a semiconductor module 700 according to an embodiment may include a processor 720 and semiconductor devices 730 that are mounted on a module substrate 710. The processor 720 and/or the semiconductor devices 730 may include one or more 3D stacked SRAM circuits described in the one or more embodiments.

Figure 8:
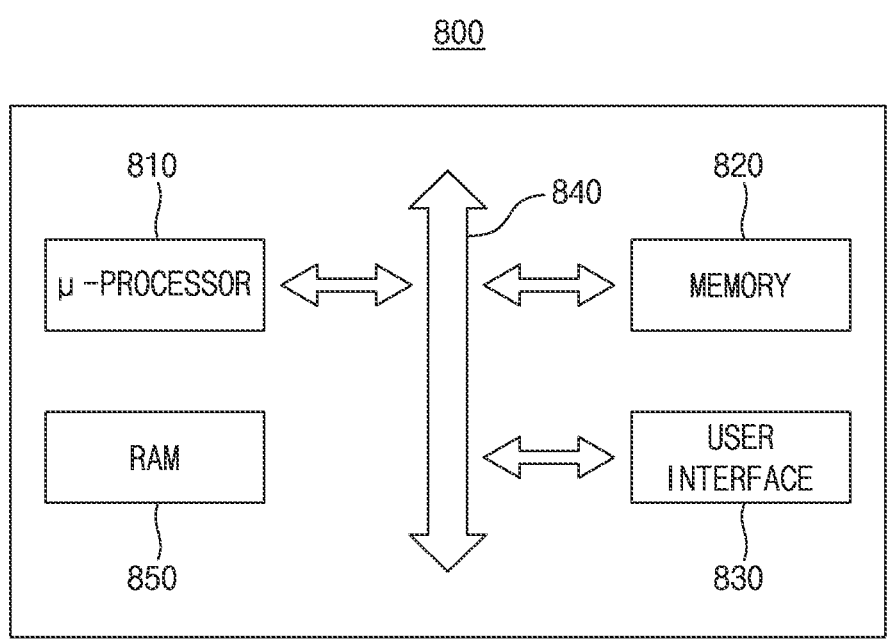
FIG. 8 is a schematic block diagram illustrating an electronic system according to an embodiment.

FIG. 8 is a schematic block diagram of an electronic system according to an embodiment.

Referring to FIG. 8, an electronic system 800 in accordance with an embodiment may include a microprocessor 810, a memory 820, and a user interface 830 that perform data communication using a bus 840. The microprocessor 810 may include a central processing unit (CPU) or an application processor (AP). The electronic system 800 may further include a random access memory (RAM) 850 in direct communication with the microprocessor 810. The microprocessor 810 and/or the RAM 850 may be implemented in a single module or package. The user interface 830 may be used to input data to the electronic system 800, or output data from the electronic system 800. For example, the user interface 830 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 820 may store operational codes of the microprocessor 810, data processed by the microprocessor 810, or data received from an external device. The memory 820 may include a memory controller, a hard disk, or a solid state drive (SSD).

At least the microprocessor 810, the memory 820 and/or the RAM 850 in the electronic system 800 may include one or more 3D stacked SRAM circuits described in the one or more embodiments.

Some of the embodiments of the disclosure have been shown and described above. However, the one or more embodiments of the disclosure are not limited to the aforementioned specific embodiments. It may be understood that various modifications, substitutions, improvements and equivalents thereof can be made without departing from the spirt and scope of the disclosure. It should be understood that such modifications, substitutions, improvements and equivalents thereof shall fall within the protection scope of the disclosure, and should not to be construed independent from the inventive concept or prospect of the disclosure.

What is claimed is:

1. A semiconductor device comprising:
   a first transistor stack including a first channel and a first gate;
   a second transistor stack including a second channel and a second gate, the second transistor stack being disposed above the first transistor stack;
   a bit line disposed on a first portion of an upper surface of the first channel;
   a voltage source disposed on a first portion of an upper surface of the second channel; and
   a first shared contact connecting the first channel to the second channel,
   wherein a width of a source/drain region comprising the first portion of the second channel is less than a width of a source/drain region comprising the first portion of the first channel.

2. The semiconductor device of claim 1, wherein the first shared contact is disposed on a second portion of the upper surface of the first channel and on a second portion of the upper surface of the second channel.

3. The semiconductor device of claim 2, wherein the first portion of the first channel and the second portion of the second channel are located opposite from each other with respect to the first shared contact.

4. The semiconductor device of claim 1, further comprising:
   a voltage ground disposed on the first channel of the first transistor stack.

5. The semiconductor device of claim 4, wherein the voltage ground is disposed on the upper surface of the first channel.

6. The semiconductor device of claim 1, wherein the upper surface of the first channel comprises at least one from among an arc shape, a flat shape, and a recess, on which the bit line is disposed, and
   wherein the upper surface of the second channel comprises at least one from among the arc shape, the flat shape, and the recess, on which the voltage source is disposed.

7. The semiconductor device of claim 1, wherein the first transistor stack includes a third channel and a third gate, the third channel being disposed adjacent to the first channel in the first transistor stack,
   wherein the second transistor stack includes a fourth channel and a fourth gate, the fourth gate being disposed adjacent to the second channel in the second transistor stack, and wherein the third channel and the fourth channel are connected by a second shared contact.

8. The semiconductor device of claim 7, further comprising:
a first cross-couple contact connecting the first shared contact to the fourth gate in the second transistor stack; and
a second cross-couple contact connecting the second shared contact to the second gate in the second transistor stack.

9. The semiconductor device of claim 7, wherein the first transistor stack includes a fifth gate connected to the first channel and a sixth gate connected to the third channel.

10. The semiconductor device of claim 9, further comprising:
a first dummy gate and a second dummy gate in the second transistor stack,
wherein the first dummy gate is disposed above the fifth gate and the second dummy gate is disposed above the sixth gate.

11. The semiconductor device of claim 9, wherein the first channel penetrates through the first gate and the fifth gate, and
wherein the third channel penetrates through the third gate and the sixth gate.

12. The semiconductor device of claim 1, wherein a difference between the width of the first channel and the width of the second channel is at least 10 nm.

13. The semiconductor device of claim 1, wherein the first transistor stack and the second transistor stack constitute a static random access memory (SRAM) in a three-dimensional (3D) stack.

14. A semiconductor device comprising:
a first transistor stack including a first channel and a first gate;
a second transistor stack including a second channel and a second gate, the second transistor stack being disposed above the first transistor stack;
a bit line disposed on a first portion of an upper surface of the first channel;
a voltage source disposed on a first portion of an upper surface of the second channel; and
a first shared contact connecting the first channel to the second channel,
wherein a width of the second channel is less than a width of the first channel, and
wherein the bit line is disposed on a first portion of an upper surface of the first channel without making a lateral contact on the first channel.

15. The semiconductor device of claim 14, wherein the bit line penetrates through the dielectric to be connected to the upper surface of the first channel.

16. A semiconductor device comprising:
a three-dimensional (3D) stack including a plurality of transistors disposed in a first layer and a second layer, the second layer being disposed above the first layer;
the first layer including a first gate and a first channel of a first transistor and a second gate and a second channel of a second transistor, among the plurality of transistors;
the second layer including a third gate and a third channel of a third transistor and a fourth gate and a fourth channel of a fourth transistor, among the plurality of transistors; and
a first shared contact and a second shared contact,
wherein the third channel is disposed above the first channel, and is connected to the first channel by the first shared contact,
wherein the fourth channel is disposed above the second channel, and is connected to the second channel by the second shared contact, and
wherein a width of the third channel is less than a width of the first channel, and a width of the fourth channel is less than a width of the second channel.

17. The semiconductor device of claim 16, further comprising:
a bit line connected to a first end of the first channel and a first end of the second channel; and
a voltage ground connected to a second send of the first channel and a second end of the second channel.

18. The semiconductor device of claim 16, further comprising:
a voltage source connected to the third channel and the fourth channel,
wherein the voltage source is disposed on an upper surface of the third channel and an upper surface of the fourth channel.

19. The semiconductor device of claim 16, wherein the first shared contact is disposed on an upper surface of the first channel and an upper surface of the third channel, and
wherein the second shared contact is disposed on an upper surface of the second channel and an upper surface of the fourth channel.

20. A three-dimensional (3D) transistor stack comprising:
an inverter including a first channel of a first transistor and a second channel of a second transistor, the second channel being disposed directly above the first channel;
a bit line disposed on an upper surface of the first channel;
a voltage source disposed on an upper surface of the second channel;
a voltage ground disposed on the first channel; and
a shared contact connecting the first channel to the second channel,
wherein a width of a source/drain region comprising a first portion of the second channel is less than a width of a source/drain region comprising a first portion of the first channel.

* * * * *